United States Patent [19]

Schonhorn et al.

[11] 4,377,619

[45] Mar. 22, 1983

[54] PREVENTION OF SURFACE MASS MIGRATION BY MEANS OF A POLYMERIC SURFACE COATING

[75] Inventors: Harold Schonhorn, New Providence; Louis H. Sharpe, Morris Township, Morris County, both of N.J.

[73] Assignee: Bell Telephone Laboratories, Incorporated, Murray Hill, N.J.

[21] Appl. No.: 261,890

[22] Filed: May 8, 1981

[51] Int. Cl.³ .................. H05K 1/00; H01L 21/58
[52] U.S. Cl. ................... 428/333; 29/577 R; 29/577 C; 29/590; 156/278; 156/289; 174/68.5; 357/70; 357/80; 427/96; 427/259; 427/82; 427/421; 427/430.1; 428/336; 428/339; 428/901
[58] Field of Search ............ 427/259, 96, 82, 421, 427/430.1; 428/333, 336, 339, 901; 29/577 R, 577 C, 590; 357/70, 80; 156/278, 289; 174/68.5

[56] References Cited

U.S. PATENT DOCUMENTS

| 3,909,680 | 9/1975 | Tsunashima | 156/90 |
| 4,100,037 | 7/1978 | Baron | 427/259 |
| 4,143,456 | 3/1979 | Inoue | 29/588 |

OTHER PUBLICATIONS

Zisman, "Relation of the Equilibrium Contact Angle to Liquid and Solid Constitution," *Advances in Chemistry Series*, 43, pp. 1–50, American Chemical Society, Washington, D.C., (1964).

Shafrin, "Critical Surface Tensions of Polymers, " *Polymer Handbook*, 2nd Edit., pp. III-221–III-228, Wiley Interscience, (1975).

Kohman et al., *The Bell System Technical Journal*, vol. 34 (6), pp. 1115–1147, (1955).

Chaikin et al., *Industrial and Engineering Chemistry*, vol. 51 (3), pp. 299–304, (1959).

*Primary Examiner*—John D. Smith
*Attorney, Agent, or Firm*—Peter V. D. Wilde; Eugen E. Pacher

[57] ABSTRACT

Method for preventing spreading of a liquid on a solid surface, e.g., an adhesive placed on a substrate, and for preventing metal migration, in particular silver migration, between conductors deposited on a surface of a substrate, and articles produced by the method. The method comprises application of a layer of polymer having room temperature critical surface tension of wetting less than about 20 dyn/cm, and less than about 0.1 μm thick, to at least a part of the surface. The polymer layer can be applied by any convenient method, including dipping, spraying, painting, printing, and plasma deposition. A preferred polymer is poly(1H, 1H-pentadecafluorooctyl methacrylate) (PDFOM), which can be advantageously applied in the form of a solution, typically in a fluorinated hydrocarbon such as Freon ® TF, with PDFOM concentration typically between about 0.001% and about 2% by weight. Thin PDFOM layers according to the invention covering the substrate area on which the adhesive is placed later do not unduly decrease the strength of the adhesive bond formed, and have no measurable effect on the electrical conductivity of a conducting adhesive bond. Because of these properties, a substrate surface can be coated with PDFOM, such as by dipping or spraying, and the adhesive be applied to the coated surface. Metal migration is prevented by preventing formation of a continuous electrolyte film, typically an aqueous film, between conductors at different electrical potentials. This can be achieved by coating at least a part of the substrate with the polymer, e.g., PDFOM.

26 Claims, 4 Drawing Figures

PREVENTION OF SURFACE MASS MIGRATION BY MEANS OF A POLYMERIC SURFACE COATING

FIELD OF THE INVENTION

The invention pertains to a method for preventing surface mass migration by means of a polymeric layer on the surface. In particular, it pertains to a method for preventing spontaneous spreading of liquids, and for prevention of metal migration.

BACKGROUND

Unwanted surface mass migration has been a problem in many areas of technology, and many methods exist for preventing of alleviating the problem in particular situations. Since this applications is concerned with two particular forms of mass migration, namely, the spontaneous spreading or bleeding of a liquid, and the movement of metal ions under the influence of an electric field that is involved in the phenomenon of metal migration, typically silver migration, we will restrict our discussion to these two forms of surface mass migration.

The spontaneous spreading of a liquid on a solid surface, that is to say, the wetting of a solid surface by a liquid, has been studied extensively. See for instance, *Contact Angle, Wettability, and Adhesion, Advances in Chemistry Series*, 43, American Chemical Society, Washington, D.C., 1964, especially pages 1 through 49. As discussed there, spontaneous spreading occurs if the contact angle between liquid and solid goes to zero, and conversely, spontaneous spreading does not occur if this contact angle remains finite. The latter occurs when, loosely speaking, the surface energy of the solid/liquid interface is less than or equal to the difference in surface energy between the solid/vapor interface and the liquid/vapor interface. This relationship suggests that liquids will tend not to spread spontaneously on solid surfaces of suitably low surface energy. such behavior is in fact observed.

It has also been observed that coating a high energy surface with a film of low surface energy material results in a reduced tendency of liquids to spread spontaneously on this surface. Furthermore, it is known that the wettability of low-energy organic surfaces, or of high-energy surfaces coated by organic films, is determined essentially by the nature and packing of the exposed surface atoms, and is typically independent of the nature and arrangements of the underlying atoms and molecules. For instance, if a surface is covered by a thin adsorbed film comprising long-chain, unbranched, amphiphatic molecules which are able to form a close-packed array with terminal —CH$_3$, —CF$_2$H, or —CF$_3$ groups, then only liquids having relatively low surface energy will spread spontaneously on the surface. Fluorinated materials possess lower critical surface tensions of wetting than their hydrogenated counterparts, with a close-packed monolayer of —CF$_3$ groups having the lowest critical surface tension of wetting known, about 6 dyn/cm (at 20° C.).

The theoretical understanding of wetting forms the basis of some technologically important practices. For instance, poly (1H, 1H-pentadecafluorooctyl methacrylate), to be referred to herein as PDFOM, a commercially available polymer having a critical room temperature surface tension of wetting of about 11 dyn/cm, is used in industry, inter alia, as a so-called "barrier compound" for preventing the creepage and subsequent loss of lubricating oils, and for directing or "channeling" the flow of such oils, in addition to its use in blocking the spread of mobile fractions of, e.g., silicone encapsulants, and in ensuring dropwise, rather than film-type, condensation.

A typical way of using a film having a low surface energy to prevent spreading or bleeding of a relatively high-viscosity liquid such as a resin is taught by U.S. Pat. No. 4,143,456, issued Mar. 13, 1979 to K. Inoue for a "Semiconductor Device Insulation Method." That patent teaches formation of a thick film of a repellent substance on a surface in a predetermined shape around the area to which the liquid is to be confined. If the repellent material has sufficiently low surface energy then the liquid, upon encountering the repellent layer will assume a nonzero contact angle and thus will cease to spread. This approach, although being effective, has certain disadvantages. For instance, since it requires printing a repellent line around each area to which liquid is to be confined, the method is difficult to apply when a high density of components is to be adhesively affixed to a substrate, as is often the case in electronic device manufacture. And even if the component density is not high, the method still requires a relatively complex processing step, namely the printing of the patterned repellent film.

A problem that is conceptually unrelated to the wetting of solid surfaces by liquids, although, in practice, strongly affected thereby, is metal migration, in particular, silver migration. See, for instance, Saul W. Chaikin et al., *Industrial and Engineering Chemistry*, Volume 51(3), pp. 299–304, (1959). In metal migration, an electric field causes metal ions to move from a metallic conductor deposited on an insulator either into or along the insulator surface in the direction of increasing electrical potential, typically towards another nearby conductor that is at a lower electrical potential than the first. In electronic equipment using printed conductors, for instance, this phenomenon is highly deleterious, since it can result in short-circuiting.

Since of all commonly used conductor materials silver is most susceptible to metal ion migration, the phenomenon has been mostly studied in the form of silver migration. Various approaches have been used to prevent or reduce silver migration, such as, for instance, coating the silver-containing conductor with gold, solder, or other materials, treating the insulator surface, or alloying the silver. In particular, since it appeared likely that reducing adsorption of water on the insulating substrate surface would reduce the intensity of silver migration on normally susceptible materials, Chaikin et al. have used a silicone-product to treat a melamine-glass laminate substrate, and this treatment was found to reduce silver migration by roughly 75% (i bid, page 302). A somewhat different approach is taught by U.S. Pat. No. 3,909,680, issued Sept. 30, 1975 to E. Tsunashima, for "Printed Circuit Board with Silver Migration Prevention." The patent teaches use of an undercoating and/or an overcoating comprising insulating resin and an organic inhibitor.

Both the method of preventing silver migration by means of treating the insulator surface with a silicone product and that of using coating layers comprising an inhibitor require additional processing steps, and furthermore result in modifications of the surface that typically, inter alia, affect the ease of component replacement.

Because of the shortcomings of prior art methods for preventing unwanted spreading of liquids as well as of those for preventing metal migration on surfaces, convenient, inexpensive, and reliable methods for achieving these ends that do not substantially impair any desirable properties of the surface are of considerable interest.

SUMMARY OF THE INVENTION

Disclosed is a simple and convenient method for preventing surface mass migration that can, inter alia, be used to prevent the spontaneous spreading of a liquid such as, for instance, an uncured adhesive, including the spreading of a liquid fraction of a mixture. In this modification, the method comprises applying a thin layer of an organic polymer having a room temperature critical surface tension of wetting of less than about 20 dyn/cm to all or part of the surface whereon a liquid is to be confined to within a certain area, either before or after contacting the surface with the liquid. A preferred method for applying the polymer is to dip the substrate into a solution of the polymer in a common solvent such as a fluorinated hydrocarbon. Upon evaporation of the solvent, the residue forms a thin layer of the polymer that suffices to substantially reduce or prevent spreading. An exemplary polymer is PDFOM, thin layers of which are, inter alia, effective in preventing the bleeding of conductive adhesive paste used in e.g., the bonding of IC chips or discrete semiconductor device to gold-plated ceramic substrates. Thin layers of this material are thermally stable to about 200° C. and thus do not interfere with typical subsequent processing steps. When interposed in the form of a thin layer, e.g., a monolayer, between substrate and adhesive, PDFOM does not unduly degrade the adhesive bond strength, and does not substantially affect the electrical conductivity of the bond. Other methods for applying a layer of a suitable low surface energy polymer to a surface are for instance, plasma deposition, spraying, painting, or printing.

Disclosed also is a method for preventing metal migration from a conductor deposited on an insulating substrate. The method relies on the prevention of formation of a continuous electrolyte film on the surface between the conductor at a relatively high electrical potential and a surface region that is at relatively low electrical potential. This can be achieved by interposing between the two regions a layer of low surface energy material, as well as by coating the surface with such a layer. A suitable material for this purpose is again PDFOM. The low surface energy polymer can be applied by dipping, spraying, painting, printing, or any other convenient method, typically in the form of a dilute solution of the polymer in an organic solvent, as well as by plasma deposition.

DETAILED DESCRIPTION

Figure 1:
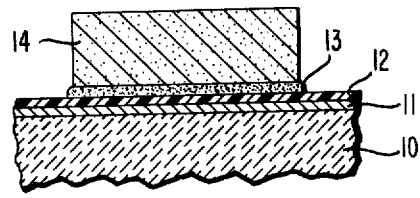
FIG. 1 schematically depicts a device assembly comprising a thin polymer layer interposed between metallized substrate and adhesive to prevent creep of the adhesive.

Organic polymers can advantageously be used to form layers having low surface energy, and the literature contains compilations of polymers including their surface tensions. For instance, *The Polymer Handbook*, Second Edition, J. Brandroup and E. A. Immergut, editors, Wiley Interscience, New York, London, Sydney and Toronto, (1975), pages III-221 to III-228 contains a table, compiled by E. G. Shafrin, of Critical Surface Tensions of Polymers. This table lists more than 50 substances having a room temperature critical surface tension of wetting of no more than about 20 dyn/cm.

As is well known, the specific surface free energies of liquids (excluding the liquid metals) are typically less than about 100 ergs/cm$^2$ at ordinary temperatures. But hard solids have free surface energies ranging from about 5000 to 500 ergs/cm$^2$, the value being higher the greater the hardness and the higher the melting point. Soft organic solids have much lower melting points, and their specific surface free energies are generally under 100 ergs/cm$^2$. Examples are waxes, solid organic polymers, and, in fact, most solid organic compounds. Thus, to insure nonspreading of liquids on any solid surface, it is required to lower the surface energy of the solid surface to a value substantially less than 100 ergs/cm$^2$. We consider that a low surface energy layer, in order to reliably prevent spontaneous liquid spreading, should have a critical surface tension of wetting of no more than about 20 dyn/cm at 20° C. Although a critical surface energy in the indicated range is the principal identifying characteristic of polymers useful in the practice of the inventive method, for at least some variants of the method the polymers should possess one or more of the following characteristics: (a) high solubility in at least one common, inexpensive, low boiling point solvent; (b) ability to substantially form continuous films upon application to the surface by appropriate means; (c) thermal stability up to at least the maximum processing temperature the film is to be subjected to; (d) bondability, i.e., the characteristic that the presence of a thin layer of the polymer between substrate surface and item to be bonded to the substrate does not unduly degrade the strength of an adhesive bond between item and substrate. We will discuss now these characteristics.

(a) Solubility:

Since a very thin layer, sometimes even a monomolecular layer, but, in any case, a layer no more than about 0.1 μm thick, suffices to impart the necessary low surface energy characteristics to a surface, it is typically desirable to apply the polymer in a way that results in the formation of such a thin film. Many techniques for applying the polymer are possible, including dipping, spraying, printing, painting, or plasma deposition. All but the last of these are advantageously practiced with solutions of the polymer. We have found that properly adjusting the concentration of polymer dissolved in an appropriate solvent is an easy way to control the average thickness of the polymer film remaining on the surface after evaporation of the solvent.

(b) Film-Formation:

Since, in order to be fully effective, a low-surface-energy layer must result in substantial coverage of the substrate area to which it has been applied, it is clear that a substance useful in the practice of the inventive method should be film-forming. This property is common among polymers.

(c) Thermal Stability:

In many applications of the inventive method a processng step subsequent to the application of the low surface energy polymer includes treatment of the article at elevated temperature. Typical steps are, for instance, curing of adhesives or encapsulants, or setting of such materials as thermosetting conductive pastes. Many of these treatments are carried out at temperatures between 100° and 200° C. For this reason, polymers useful for the practice of the inventive method typically should be thermally stable at temperatures up to about 175° C., preferably up to about 200° C., where by "thermally stable" we mean that maintaining the polymer film at the elevated temperature for a period of up to several hours does not result in such degradation or loss of the film as to significantly impair its functionality.

(d) Bondability:

In some applications of the inventive method it is desirable to prevent the spreading or bleeding of uncured adhesive material. An example of such an application is the prevention of bleeding of uncured metal-filled adhesive used to bond IC chips to a metallized substrate, e.g., a metallized ceramic. Convenient exemplary methhods for applying a low surface energy polymer to the substrate surface are dipping the substrate into a solution of the polymer, spraying such a solution onto the substrate, or plasma-depositing the layer on the substrate. All of these application methods, if applied prior to the application of the adhesive to the substrate, result in formation of a polymer film over substantially all of the substrate surface, including the area to which the adhesive will be applied. After placing an appropriate small quantity of adhesive either onto the bonding surface of the item to be affixed, e.g., the IC chip, or onto the appropriate spot on the substrate surface, the item is typically placed in position on the substrate, and the bond formed by curing the adhesive. This arrangement is schematically shown in cross section in FIG. 1. Substrate 10, with metallizing layer 11 deposited thereon, is covered by a thin layer 12 of low surface energy polymer. A small amount of conductive adhesive 13 is placed onto the polymer layer, and semiconductor device 14 positioned on the adhesive-covered spot.

It is obvious that the outlined approach will not be of practical value unless the resulting adhesive bond is of sufficient strength for the particular intended use despite the presence of the low surface energy film on the substrate. Permissible decreases in bond strength depend, of course, on the specifics of the situation, but decrease should typically not exceed about 50%.

An example of a substance that possesses the above-indicated desirable qualities is PDFOM. It is soluble in organic solvents, such as, for instance, fluorinated hydrocarbons, is film-forming, stable up to about 200° C., and does not unduly degrade bond strength of commonly used chip-bonding adhesives. In addition, it is readily available from commercial sources. In an exemplary application, a gold-plated ceramic substrate to which an IC chip was to be bonded was dipped into a 0.05% solution of PDFOM in Freon ® TF, a commercially available fluorinated hydrocarbon, and withdrawn slowly from the solution. After evaporation of the solvent, which typically occurs already during withdrawal of the substrate, but is certainly complete within seconds of the withdrawal, a film of conductive epoxy adhesive was transferred to the appropriate area of the gold-plated ceramic substrate, followed by placing the chip on the adhesive, using light pressure to set the chip and to thin the adhesive film to about 1 $\mu$m, followed by curing the adhesive for about 45 minutes at 175° C. Using this procedure on substrates that were either chemically or plasma cleaned prior to dipping resulted in assemblies that showed essentially no spreading of adhesive, even after prolonged storage of the uncured assembly at room temperature, whereas typically such assemblies not subjected to the inventive treatment showed considerable spreading. The strength of the bond resulting when using the inventive method was approximately 25% less than that of comparable bonds not involving a film of PDFOM, with bond strength showing some decrease with increasing solute concentration (and thus film thickness). Electrical conductivity of the bond was not measurably changed by the inventive treatment.

Figure 2:
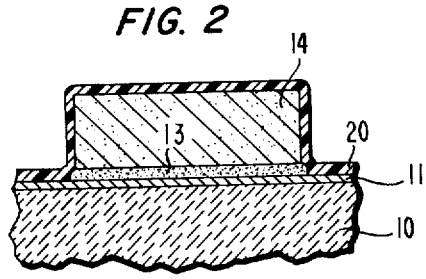
FIG. 2 shows an assembly comprising a polymer layer covering substrate and device to also prevent creep.

Other techniques for applying a thin layer of low surface energy polymer to a surface exist. For instance, in the manufacture of electronic devices comprising one or more semiconductor chips adhesively bonded to a substrate, e.g., a metallized ceramic substrate, it is at times advantageous to put adhesive and chips onto the untreated substrate, i.e., prior to application of the polymer layer to the substrate, followed by application of the polymer to all or part of the exposed substrate surface, such as for instance by spraying. This is shown schematically in FIG. 2. Onto substrate 10, with metallizing layer 11 deposited thereon, are placed conductive adhesive 13 and device 14, and the whole assembly covered, prior to curing of the adhesive, with low surface energy polymer layer 20.

In this variant of the inventive method substantially no polymer is disposed between either substrate and adhesive, or adhesive and the item to be bonded to the substrate, and therefore the polymer film does not significantly affect bond strength or conductivity. The time between putting the adhesive onto the substrate and applying the polymer is typically to be kept short, in order to avoid any significant amount of adhesive spreading.

A thin film of low surface energy polymer is also effective in preventing metal migration, particularly silver migration, typically through prevention of formation of a continuous electrolyte film between the conductor at relatively high electrical potential and an adjacent region at relatively low electrical potential. By "conductor" we mean not only thin metal film conductors but also "thick film" conductors formed from metal-filled pastes.

Figure 3:
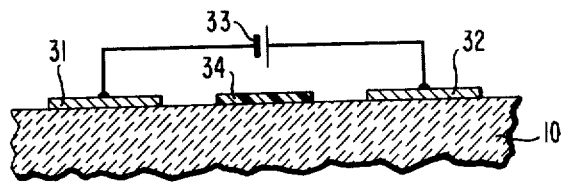
FIG. 3 schematically shows a strip of polymer disposed between two conductors on a substrate to prevent metal migration.

Although in principle an appropriately placed narrow strip of an appropriate low surface energy polymer layer on the surface suffices to prevent the formation of such a continuous film, the layer can be applied by any of the techniques mentioned previously, as well as by others not explicitly mentioned. The former approach is schematically shown in FIG. 3. Conductors 31 and 32 are deposited onto insulating substrate 10, with 32 being at a higher electrical potential than 31, as is indicated by battery 33 connected between the conductors. A strip 34 of low surface energy polymer is disposed on the substrate surface between the conductors, thereby preventing formation of a continuous electrolyte path between 31 and 32.

Figure 4:
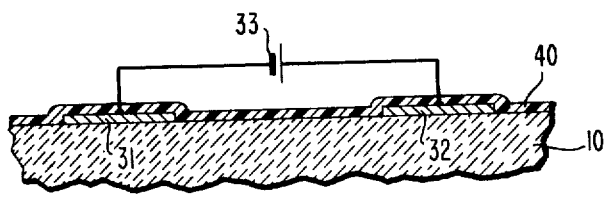
FIG. 4 depicts two conductors on a substrate, with a polymer layer covering conductors and substrate to prevent metal migration.

Other convenient techniques for preventing metal migration comprise dipping the conductor-bearing assembly into a solution of the appropriate polymer (i.e., of one having critical surface tension of wetting less than about 20 dyn/cm) in an appropriate solvent, of spraying the conductor-bearing assembly with such a solution, or of plasma-depositing an appropriate polymer film onto the assembly. The result of such treatment is schematically depicted in FIG. 4, where low surface energy polymer layer 40 covers the surface of substrate 10 as well as conductors 31 and 32, the conductors being at different electrical potentials as indicated by battery 33 connected between the conductors.

We have found that PDFOM, the preferred substance for the prevention of spontaneous spreading of liquids, is also preferred for the prevention of metal migration, particularly silver migration. In an exemplary use, substrates, each bearing silver-containing conductors and four adhesively bonded diodes in a bridge configuration, were coated with a thin layer of PDFOM by immersion, without prior treatment, in some cases, and after plasma cleaning in others, in a shallow pool of a 0.2% solution of the compound in Freon TF, a fluorinated hydrocarbon. Subsequent life tests revealed a significant reduction of failure due to silver migration in devices that had undergone treatment according to the invention over devices that had not been subjected to such treatment.

The thickness of the low-surface-energy layer required to substantially prevent mass migration on a particular surface depends, inter alia, on the condition of the surface. For instance, it was found necessary to dip metallized ceramic substrates into PDFOM solutions of 0.01% by weight and higher concentrations to completely prevent bleeding at 175° C., whereas the same result was achieved at 0.005% concentration for gold-plated copper substrates at that temperature.

The minimum required thickness of polymer for the prevention of surface mass migration is approximately a monomolecular layer. For typical application techniques this implies a minimum concentration of low surface energy polymer in a solvent to be about 0.001% by weight. On the other hand, for most applications the maximum useful layer thickness typically does not exceed about 0.1 μm, implying a typical maximum solute concentration of the order of 2% by weight, although more concentrated solutions, including saturated solutions, may be found useful in some circumstances. For instance, in applications where no subsequent bonding of items to the substrate is to take place, the use of relatively thick layers may be advantageous. An example of this is the dip- or spray-coating of a conductor- and device-bearing substrate, e.g., a ceramic substrate or a circuit board, with polymer to prevent metal migration. Another example is the spray-coating of an assembly comprising uncured adhesive. On the other hand, in applications where the polymer layer is interposed between, e.g., adhesive and substrate, relatively thin layers, even monolayers, are typically preferable, since bond strength tends to decrease with increasing layer thickness.

What is claimed is:

1. Method for fabricating an article comprising a substrate having at least one first surface region covered with a substance at least part of which is capable of undergoing surface mass migration, and at least one second surface region that is not covered with the substance, the method comprising (a) applying a layer of material to at least part of the second surface region, characterized in that (b) the material comprises a polymer having a critical surface tension of wetting of less than about 20 dyn/cm at room temperature, and (c) the layer of material applied is no more than approximately 0.1 μm thick.

2. Method of claim 1, wherein the substance capable of undergoing surface mass migration comprises a liquid, and the mass migration is spontaneous spreading of the liquid.

3. Method of claim 1, wherein the layer of material is applied also to at least part of the first surface region before that region is covered with the substance.

4. Method of claim 1, wherein the layer of material is applied to the first and second surface regions before the first region is covered with the substance, the substance is an adhesive, and the strength after curing of the bond between adhesive and substrate is no less than about 50% of the strength of a bond formed between adhesive and substrate in the absence of the layer of material thereon.

5. Method of claim 1 wherein the substance covering the first surface region is an adhesive, a solid item to be bonded to the substrate is placed in contact with the adhesive, and the layer of material is applied after placing the item in contact with the adhesive, but prior to curing the adhesive.

6. Method of claim 1 wherein the substance capable of undergoing surface mass migration is a metal comprising an electrical conductor disposed on the substrate, and the mass migration is metal migration.

7. Method of claims 2 or 6 wherein the layer of material is applied by contacting at least part of the surface regions with a solution comprising the polymer.

8. Method of claim 7 wherein the polymer is poly (1H, 1H-pentadecafluorooctyl methacrylate), the solvent is a fluorinated hydrocarbon and the concentration of the polymer in the solvent is at least about 0.001% by weight.

9. Method of claim 8, wherein the concentration of the polymer in the solvent is less than about 2% by weight.

10. Method of claims 2 or 6 wherein the applying of the material is done by dipping the substrate into a solution comprising the polymer.

11. Method of claims 2 or 6 wherein the applying of the material is done by spraying the substrate with a solution comprising the polymer.

12. Method of claim 6 wherein the conductor comprises silver.

13. Method of claim 12 wheren the layer of material is applied only to a part of the second surface region.

14. Method of claim 12 wherein the layer of material is applied to the conductor and at least part of the second surface region.

15. Method for fabricating an article comprising a substrate and a solid item affixed to a surface of the substrate by means of adhesive bonding, the method comprising (a) contacting, prior to application of the adhesive, at least part of the surface of the substrate with an amount of a 0.001% to 2% by weight solution of poly (1H, 1H-pentadecafluorooctyl methacrylate) (PDFOM), the amount being sufficient to result in formation on the surface of a layer of PDFOM less than about 0.1 μm thick, and (b) placing the adhesive and the solid item onto the PDFOM-covered substrate surface.

16. Method for fabricating an article comprising a substrate and a solid item affixed to a surface of the substrate by means of adhesive bonding, the method comprising
   (a) placing the adhesive and the solid item onto the surface of the substrate, and thereafter, but prior to curing the adhesive,
   (b) contacting at least part of the surface of the substrate with an amount of a 0.001% to 2% by weight solution of poly(1H, 1H-pentadecafluorooctyl methacrylate) (PDFOM), the amount being sufficient to result in formation on the surface of a layer of PDFOM less than about 0.1 μm thick.

17. Method for fabricating an article comprising a plurality of spaced apart electrical conductors comprisng metallic silver deposited on an insulating substrate, the method comprising
   contacting at least part of the surface of the substrate bearing the conductor with an amount of a 0.001% to 2% by weight solution of poly (1H,1H-pentadecafluorooctyl methacrylate) (PDFOM), the amount being sufficient to result in formation on the surface of a layer of PDFOM less than about 0.1 μm thick.

18. Method of claims 15, 16, or 17 wherein PDFOM is dissolved in a fluorinated hydrocarbon.

19. Article comprising
   (a) a substrate, and
   (b) a semiconductor electronic device affixed to a substrate surface by means of an adhesive, characterized in that
   (c) a layer, consisting essentially of polymer having a room temperature critical surface tension of wetting less than about 20 dyn/cm, the layer being less than about 0.1 μm thick, is disposed over at least a part of the substrate surface including the area to which the device is affixed.

20. Article comprising
   (a) a substrate, and
   (b) a semiconductor electronic device affixed to a substrate surface by means of an adhesive, characterized in that
   (c) a layer, consisting essentially of polymer having a room temperature critical surface tension of wetting less than about 20 dyn/cm, the layer being less than about 0.1 μm thick, is disposed over at least a part of the substrate surface and over at least a part of the device.

21. Article comprising
   (a) a substrate, and
   (b) a plurality of spaced apart electrical conductors comprising metallic silver deposited on a surface of the substrate, characterized in that
   (c) a layer, consisting essentially of polymer having a room temperature critical surface tension of wetting less than about 20 dyn/cm, the layer being less than about 0.1 μm thick, is disposed over at least a part of the substrate surface.

22. Article according to claim 21 wherein the layer is disposed also over at least one of the conductors.

23. Article according to claims 19, 20, or 21 wherein the polymer is poly (1H, 1H-pentadecafluorooctyl methacrylate).

24. Method for manufacturing an article comprising a substrate and a semiconductor device affixed to a substrate surface by means of an adhesive, characterized in that the method comprises disposing a layer, consisting essentially of polymer having a room temperature critical surface tension of wetting less than about 20 dyn/cm, the layer being less than about 0.1 μm thick, over at least a part of the substrate surface including the area to which the device is to be affixed.

25. Method for manufacturing an article comprising a substrate and a semiconductor device affixed to a substrate surface by means of an adhesive characterized in that the method comprises disposing a layer, consisting essentially of polymer having a room temperature critical surface tension of wetting less than about 20 dyn/cm, the layer being less than about 0.1 μm thick, over at least a part of the substrate surface and over at least a part of the device.

26. Method for manufacturng an article comprising a substrate and a plurality of spaced apart electrical conductors comprising metallic silver deposited on a surface of the substrate, characterized in that the method comprises disposing a layer, consisting essentially of polymer having a room temperature critical surface tension of wetting less than about 20 dyn/cm, the layer being less than about 0.1 μm thick, over at least a part of the substrate surface.

* * * * *